United States Patent
Choi et al.

(10) Patent No.: US 9,616,614 B2
(45) Date of Patent: Apr. 11, 2017

(54) LARGE AREA IMPRINT LITHOGRAPHY

(71) Applicants: Byung-Jin Choi, Austin, TX (US); Se Hyun Ahn, Austin, TX (US); Mahadevan GanapathiSubramanian, Cedar Park, TX (US); Michael N. Miller, Austin, TX (US); Sidlgata V. Sreenivasan, Austin, TX (US)

(72) Inventors: Byung-Jin Choi, Austin, TX (US); Se Hyun Ahn, Austin, TX (US); Mahadevan GanapathiSubramanian, Cedar Park, TX (US); Michael N. Miller, Austin, TX (US); Sidlgata V. Sreenivasan, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 892 days.

(21) Appl. No.: 13/773,217

(22) Filed: Feb. 21, 2013

(65) Prior Publication Data

US 2013/0214452 A1 Aug. 22, 2013

Related U.S. Application Data

(60) Provisional application No. 61/601,632, filed on Feb. 22, 2012.

(51) Int. Cl.
| | |
|---|---|
| *B29C 35/08* | (2006.01) |
| *B29C 59/02* | (2006.01) |
| *G03F 7/00* | (2006.01) |
| *B82Y 10/00* | (2011.01) |
| *B82Y 40/00* | (2011.01) |

(52) U.S. Cl.
CPC ............ *B29C 59/026* (2013.01); *B82Y 10/00* (2013.01); *B82Y 40/00* (2013.01); *G03F 7/0002* (2013.01)

(58) Field of Classification Search
CPC ........ B29C 59/026; B82Y 10/00; B82Y 40/00
See application file for complete search history.

(56) References Cited

U.S. PATENT DOCUMENTS

| | | | |
|---|---|---|---|
| 6,873,087 | B1 | 3/2005 | Choi et al. |
| 6,936,194 | B2 | 8/2005 | Watts |
| 7,157,036 | B2 | 1/2007 | Choi et al. |
| 7,691,313 | B2 | 4/2010 | Choi et al. |
| 8,076,386 | B2 | 12/2011 | Xu et al. |
| 2004/0065252 | A1 | 4/2004 | Sreenivasan et al. |
| 2004/0065976 | A1 | 4/2004 | Sreenivasan et al. |
| 2005/0106321 | A1 | 5/2005 | McMackin et al. |

(Continued)

FOREIGN PATENT DOCUMENTS

| | | | |
|---|---|---|---|
| EP | | 1473594 A2 | 11/2004 |
| WO | WO 90/15673 | | 12/1990 |
| WO | WO 2011/094014 | | 8/2011 |

*Primary Examiner* — Joseph S Del Sole
*Assistant Examiner* — John Robitaille
(74) *Attorney, Agent, or Firm* — Cameron A. King (57) ABSTRACT

Methods and systems are provided for patterning polymerizable material dispensed on flexible substrates or flat substrates using imprint lithography techniques. Template replication methods and systems are also presented where patterns from a master are transferred to flexible substrates to form flexible film templates. Such flexible film templates are then used to pattern large area flat substrates. Contact between the imprint template and substrate can be initiated and propagated by relative translation between the template and the substrate.

5 Claims, 9 Drawing Sheets

(56) References Cited

U.S. PATENT DOCUMENTS

| | | |
|---|---|---|
| 2005/0270312 A1 | 12/2005 | Lad et al. |
| 2006/0283539 A1 | 12/2006 | Slafer |
| 2009/0087506 A1 | 4/2009 | Hasegawa et al. |
| 2010/0104852 A1 | 4/2010 | Fletcher et al. |
| 2010/0109201 A1 | 5/2010 | Fletcher et al. |
| 2011/0183521 A1 | 7/2011 | Schmid et al. |
| 2011/0260361 A1 | 10/2011 | Im et al. |

LARGE AREA IMPRINT LITHOGRAPHY

CROSS-REFERENCE TO RELATED APPLICATIONS

This application claims the benefit under 35 U.S.C. §119 (e)(1) of U.S. Provisional No. 61/601,632, filed on Feb. 22, 2012 which is incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Imprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Imprint lithography is also useful in fabricating layers in a thin film head device for hard disks. Imprint lithography can also be used to fabricate patterned media for hard disk drives, optical devices such as polarizers for displays, photonic crystal structures, light trapping structures and filters for photovoltaic devices, nanostructures for battery electrodes, quantum dot structures for enhanced photonic and photovoltaic devices, biomedical devices, sensors, and in the fabrication of controlled nano-particles. Controlled nano-particles can be used to fabricate crystalline semiconducting materials, or as polymer-based drug carriers, among other uses. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope, for the invention may admit to other equally effective embodiments.

DETAILED DESCRIPTION

Referring to the figures, patterning on continuous or web-type substrate has been demonstrated by many research or commercial organizations. For example, micro-molding for optical devices is one of the most widely available applications. Recently, nano-imprinting on continuous or web-type substrates has been considered as a potential application wherein fine features in micron and/or sub-micron sizes may be transferred from a template to the substrate. Exemplary techniques are further described in U.S. Pat. No. 8,817,515, which is incorporated herein by reference in its entirety.

Here, flexible substrates can be either continuous web-type thin plastic substrates or individual circular, square, rectangular or similarly shaped substrates. Examples are polymer films of 10-1000 micron thick continuous films made of PET, PEN etc with or without thin coating on top. Coating material can be metal, oxide, dielectric, etc). In order to be commercially viable, nano-imprinting on flexible substrates generally needs to satisfy certain specifications, and as such, some imprinting processes may not be viable for imprinting flexible substrates. For example, thermal nano-imprinting processes (e.g., hot-embossing) typically use thick coated (spin-coat, knife edge-coat, etc) and/or deposited materials to achieve transfer of features from a template to a substrate. This process is generally not suitable for nano-imprinting on films as there are several issues in regards to process limits in relation to fine-feature transfer, ability to provide thin imprinting layers, ability to lead to residual layer needed for pattern transfer, and ability to minimize in-plane film distortion to achieve accurate pattern overlay. One of the more difficult process issues involves fine-feature transfer (e.g., below approximately 100 nm) without fine-feature distortion and/or fine-feature fracture.

Described herein are imprinting schemes for fine-feature transfer on flexible substrates. In general, imprinting schemes may include UV nano imprinting using drop on demand dispensing. In one embodiment, a substantially flat template may be used. This type of template can be made of either a circular or square/rectangular substrate made of glass material, Si, fused silica, etc. High defect-free surface quality and high precision geometry specs of this type of template can be achieved by utilizing industry established semiconductor substrate fabrication processes. During the imprinting process, the template flatness is intentionally modulated to form a desirable out-of-plane bending to improve imprinting speed and/or yield. Typically, fluid filling can be initiated either a small point-type contact and propagates in radial direction, or in line contact and propagates in the direction of the flexible substrate motion. The template may travel along substantially the same direction as a moving flexible substrate. In another embodiment, a belt shaped template may be used. This continuous template may include multiple patterning sections replicated with a master mold.

Figure 1:
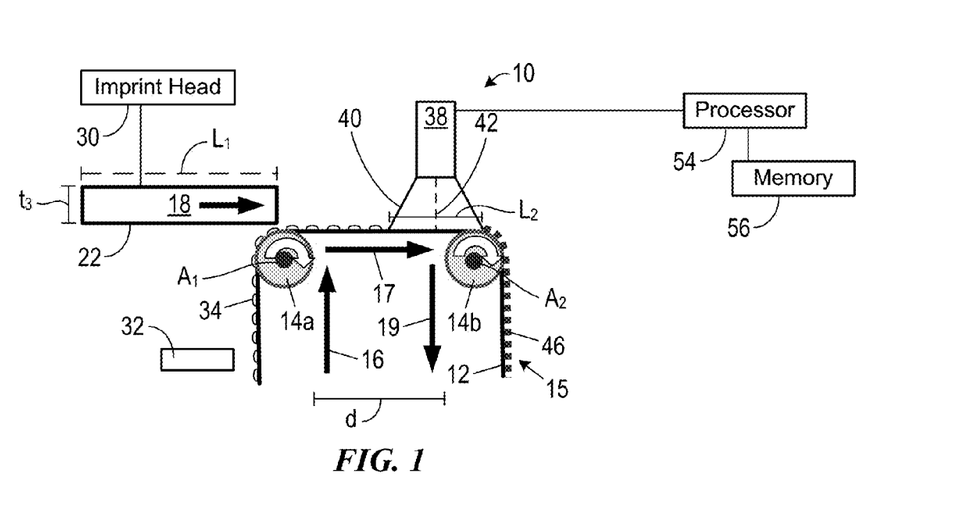
FIG. 1 illustrates a simplified side view of an exemplary embodiment of a lithography system in accordance with the present invention where the template is in contact with the flexible substrate above the first roller

Referring to FIG. 1, illustrated therein is an exemplary imprinting system 10 using a template 18 to form a relief pattern on a flexible substrate 12 in accordance with the present invention. Material composition of substrate 12 may include, but is not limited to, polymeric film, glass, silicon, silicon nitride, Kevlar™ reinforced polymer films, aluminum, and/or other similar materials and combination of these materials. For e.g., glass deposition on polymer film, or metal such as Al, Ag deposited on the polymer film. Thickness of substrate 12 may be based on design considerations. For example, substrate 12 may be a flexible sheet with a thickness of approximately 10 μm-1000 μm. In one embodiment, substrate 12 may possess sufficient porosity. Porosity magnitude (e.g., porous hole size) may be optimized such that gas molecules trapped between a template and substrate 12 during imprinting may be substantially dissipated as described in further detail herein. The porous size needs to be optimized to allow gases, He, N2, O2 or others can flow through, but imprinting fluid or moisture can not get into the substrate.

Substrate 12 may be coupled to or supported by one or more rollers 14. For example, as illustrated in FIG. 1, film sheet 12 is supported by rollers 14a and 14b. It should be noted that any number of rollers 14 may be used depending on design considerations between the first roller and the last roller. As is further explained, such rollers aid in both initiating imprinting of a patterned layer on the substrate and separating the subsequent patterned layer from the template, depending on the direction the substrate is translating. Such rollers may be further referred to herein as "imprint/separation rollers."

Figure 2:
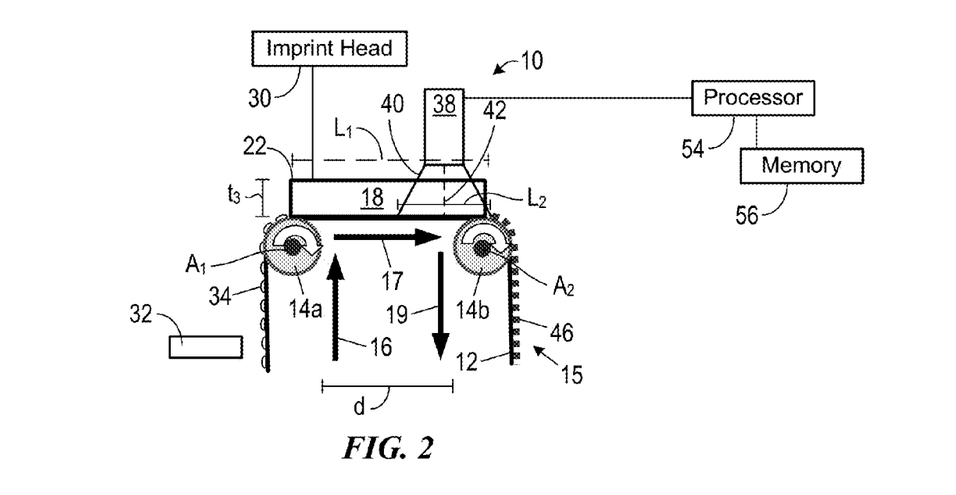
FIG. 2 illustrates a simplified side view of the lithography system of FIG. 1 where the template is in contact with the flexible substrate and a portion of the interface is under UV exposure

Rollers 14 may facilitate movement of at least a portion of substrate 12. For example, rollers 14a and 14b of FIG. 1 may each rotate about an axis to facilitate movement of substrate 12 in the direction from roller 14a to roller 14b along pathway 16, 17, 18. Such movement can initiate a contact between the template 18 and flexible substrate in the presence of imprinting fluid. Subsequently, the motion of matched translation movements of the template and flexible substrate expands the fluid-filling portion of the interface. FIG. 2 illustrates the template and substrate interface where the early fluid filled portion of the substrate is being cross linked by UV exposure. After patterning of the fixed area, rollers 14 may facilitate movement of substrate 12 to offset the first portion of substrate 12 from template 18. For simplicity in description, rollers 14 are not described in detail (e.g., diameter, material composition) as rollers for use within lithography processes are well known within the art.

In FIGS. 1 and 2, the template is illustrated as moving in translation. As an alternative scheme, template can be stationary and the roller units can move at the same time of rotation.

Each roller 14 may have an axis $A_x$. For example, rollers 14a and 14b in FIG. 1 have an axis $A_1$ and $A_2$ respectively. Axis $A_x$ of rollers 14 may be positioned substantially parallel relative to one another within system 10 and set at a distance d from each other. The distance between two rollers can be similar to the length of the imprinting field or alternatively the distance can be substantially smaller than the imprinting field. Generally, the distance is determined so that sufficient process durations of fluid filling and UV exposure are provided. If the fluid filling takes more time as compared to the UV exposure, it is necessary to allocate more portion of the roller space for the purpose of fluid filling. Rollers 14a and 14b may be positioned substantially in parallel and horizontal with respect to the template 18. Alternatively, axis $A_x$ of rollers 14 may be positioned substantially parallel but at a different height such that substrate 12 may be positioned at an angle with respect to template 18. The degree of the angle may be determined based on design considerations.

Template 18 may include a patterning surface. In one embodiment, template 18 may include a mesa extending therefrom towards substrate 12, the mesa having a patterning surface thereon. Mesa may be referred to as mold or imprint mold. Alternatively, template 18 may be formed without a mesa.

A patterning surface may be defined by a plurality of features (i.e., spaced-apart recesses and/or protrusions), though embodiments of the present invention are not limited to such configurations. The patterning surface may define any original pattern that forms the basis of a pattern to be formed on film sheet 12. Patterns can be 3D features such as stepped or free-form shapes. The patterning surface should possess low roughness so that imprinted layers yield uniform imprinted residual layer thickness. Alternatively, the patterning surface may be substantially smooth and/or planar with moderate to low nano-topographic roughness.

Template 18 and/or mold may be formed from such materials including, but not limited to, fused-silica, quartz, silicon, organic polymers, siloxane polymers, borosilicate glass, fluorocarbon polymers, metal, hardened sapphire, and/or the like. In one embodiment, at least a portion of template 18 may be formed of porous materials. Porosity magnitude (e.g., porous hole size) may be optimized such that gas molecules between template 18 and substrate 12 during imprinting may be substantially dissipated using techniques such as those described in U.S. Patent Publication Nos. 2010/0104852 and 2010/0109201, both of which are incorporated herein by reference. Template 18 could be thin film of one material on a thicker substrate of another material. The thin film thickness can be 1-100 microns and the thicker substrate of another material can be of 100 micron to 10 mm. One of embodiments can be thin SiO2 layer on top of a polymer supporting material. Patterns are formed on the thin SiO2 layer. PECVD deposited Oxide porous layer can be the thin SiO2 layer.

Template 18 may be formed of glass and/or a glass-type material. Templates 18 formed of glass may be fabricated using current imprinting tools by replication which can lower the cost of fabrication of template 18. Alternatively the template can be made directly from e-beam tools.

Referring to FIGS. 1 and 2, length $L_1$, width W, and thickness $t_3$ of template 18 may be based on design considerations. Width of the template is not illustrated in the figures. Typically the width of the template is slightly smaller than that of the flexible substrate. The ratio of the template length to the width of the template, $L_1/W$ can be 0.1 to 50. In some application areas, the ratio can be increased to 100. Template thickness and material can be selected to match its bending induced strain at the interfacing surface to that of the flexible substrate. Here, template interfacing surface is the surface where the flexible substrate contacts in the presence of the imprinting fluid. In one embodiment, template 18 may have a thickness $t_3$ between approximately 0.1-0.8 mm.

Template 18 may be coupled to a chuck (not shown). The chuck may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, the chuck may be coupled to an imprint head such that the chuck and/or the imprint head may be configured to facilitate movement of template 18. Loading and unloading of template 18 may be automated using existing semiconductor loaders.

Figure 3:
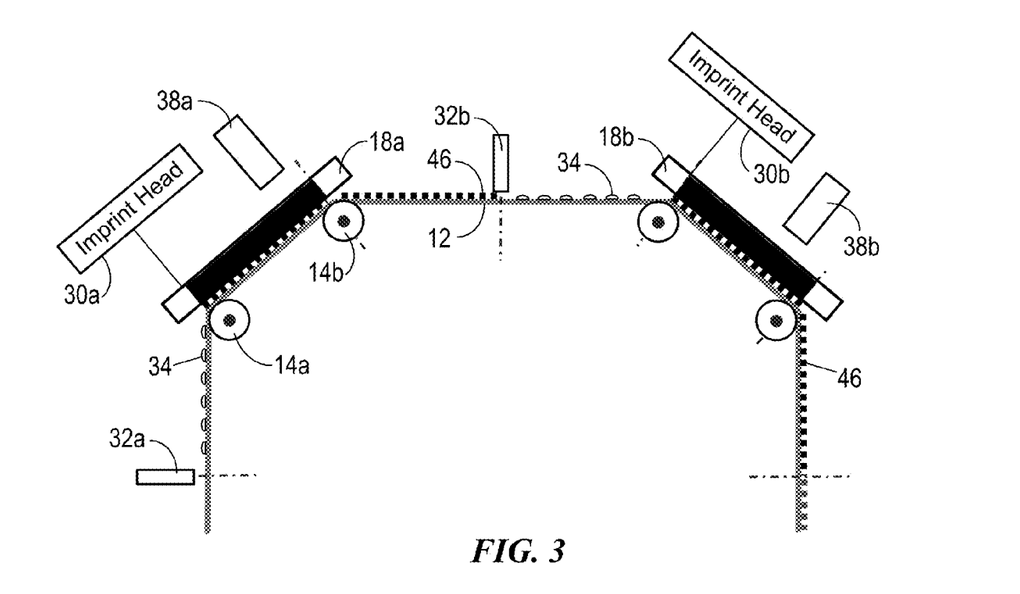
FIG. 3 illustrates a simplified side view of an exemplary embodiment of a lithography system in accordance with the present invention.

FIG. 3 illustrates a system configuration where two imprinting modules are used. This configuration can provide higher throughput as compared to the single imprint module case. Templates 18a and 18b may be coupled to imprint heads 30a and 30b respectively. All control sequences of one side for dispensing unit 32a, imprint head 30a, and UV curing unit 38a can be identically implemented to the other side with 32b, 30b and 38b. However, in order to generate consistent imprints from both modules, it will be necessary to adjust the operation conditions of the dispensing units, UV curing units, and others Referring to FIGS. 1 and 2, system 10 may further comprise fluid dispense system 32. Fluid dispense system 32 may be used to deposit formable material 34 (e.g., polymerizable material) on substrate 12. Formable material 34 may be positioned upon substrate 12 using techniques such as drop dispense, spin-coating, dip-coating, chemical vapor deposition (CVD), physical vapor deposition (PVD), flexible deposition, thick film deposition, and/or the like. For example, formable material 34 may be positioned upon substrate 12 using techniques such as those described in U.S. Patent Publication No. 2005/0270312 and U.S. Patent Publication No. 2005/0106321, both of which are hereby incorporated by reference herein.

Formable material 34 may be deposited upon flexible film substrate 12 as a plurality of spaced apart droplets. For example, formable material 34 may be deposited droplets with each droplet having a unit volume between approximately 1-200 picoliters. Droplets of formable material 34 may be disposed onto substrate 12 according to a drop pattern. The drop pattern may be based on design considerations and/or determined to provide specific characteristics such as those described in U.S. Patent Publication No. 2005/0270312. Such a drop-on-demand approach may reduce material cost, evaporation compensation, and the like.

Formable or polymerizable material 34 may comprise a monomer mixture as described in U.S. Pat. No. 7,157,036 and U.S. Pat. No. 8,076,386, both of which are hereby incorporated by reference herein. Additionally, to facilitate wetting and/or adhesion after imprinting, substrate 12 may be treated with a composition described in U.S. Pat. No. 7,691,313, which is hereby incorporated by reference herein.

Referring to FIGS. 1 and 2, system 10 may further comprise an energy source 38 coupled to direct energy 40 along path 42. Imprint head 30 and/or rollers 14 may be configured to position template 18 and a portion of substrate 12 in superimposition with path 42. Path 42 may have a length $L_2$ that is determined as a function of light curing intensity and material curing sensitivity. Typically, the ratio of $L_2$ to the template length can be 0.01 to 0.5. System 10 may be regulated by processor 54 in communication with rollers 14, imprint head 30, fluid dispense system 32, and/or source 38, and may operate on a computer readable program stored in memory 56.

Referring to FIGS. 1 and 2, imprint head 30 may vary a distance between template 18 and substrate 12 to define a desired volume therebetween that is filled by formable or polymerizable material 34. For example, imprint head 30 may apply a force to template 18 such that patterning surface 22 of template 18 contacts formable material 34. After the desired volume is filled with formable material 34, source 38 produces energy 40, e.g., ultraviolet radiation, causing formable material 34 to solidify and/or cross link, conforming to a shape of substrate 12 and patterning surface 22, defining patterned layer 46 on first portion 15 of flexible film substrate 12. Patterned layer 46 may comprise a residual layer and a plurality of features, e.g. protrusions and recessions.

Referring to FIGS. 1 and 2, template 18 may cyclically or simultaneously translate with moving substrate 12 to perform a continuous imprinting operation. Resist filling, UV curing, and separation of template 18 from substrate 12 may occur as template 18 travels at the same speed with flexible substrate 12. Motion control between the template and flexible substrate can be either passively controlled by means of mechanical set-up or actively controlled by cross-connected controllers. Mechanical set-up to maintain the motions of the template and the flexible substrate can be linkage based mechanisms, roller-to-roller in contact mechanisms, or others.

As the template and the flexible substrate initiate the in-fluid contact above first roller 14a, dispensed fluid drops fill the gap formed by two surfaces. If necessary, an array of gas purging nozzles can be positioned in front of the template and flexible substrate interfacing region. The curved flexible substrate rolling above roller 14a will form a line type contact with the template. Fluid drops will be merged as any gas between fluid drops will either be expelled from the template-substrate interfacing or dissipated through the surface of the template and/or the flexible substrate. In FIG. 1, the gas expelling direction will be in the left direction, i.e. opposite the template-substrate translating direction.

Imprint head 30 brings template 18 in contact with formable material 34 for a period of time until the template-substrate reaches UV curing location. UV curing system can be an array of LED based UV source or a line-type UV probe attached to traditional Hg—Xe UV source or similar. The distance from the UV source to the back of the template can be less than a few mm. In order to increase the UV uniformity, a thin diffusion sheet (not shown) can be positioned between the UV source and the template. When the working distance of the UV curing is less than a few mm, such as 5 mm, intensity can be maintained high enough to complete UV curing the imprinting material less than 1 sec, or 0.5 sec, or even 0.1 sec.

Referring to FIGS. 1 and 2, separation between template 18 and substrate 12 may occur as template 18 translates above roller 14b while substrate 12 is bent away from template 18, in the direction of arrow 19. Most of the bending occurs to the flexible substrate when the bending stiffness of the template is significantly larger than that of the flexible substrate. Therefore, flexible substrate 12 and template 18 generate different strains due to bending, and as such, imprinted features may suffer pattern deformation and/or failure when the strain is not balanced.

Prior art methods for reducing strain include balancing two strains from a template and substrate by controlling back pressure/vacuum. Exemplary methods are further described in U.S. Patent Publication No. 2011/0260361, which is hereby incorporated by reference in its entirety. For continuous flexible substrates, however, back pressure control may not be practical as separation may occur on a rotating roller.

Figure 4:
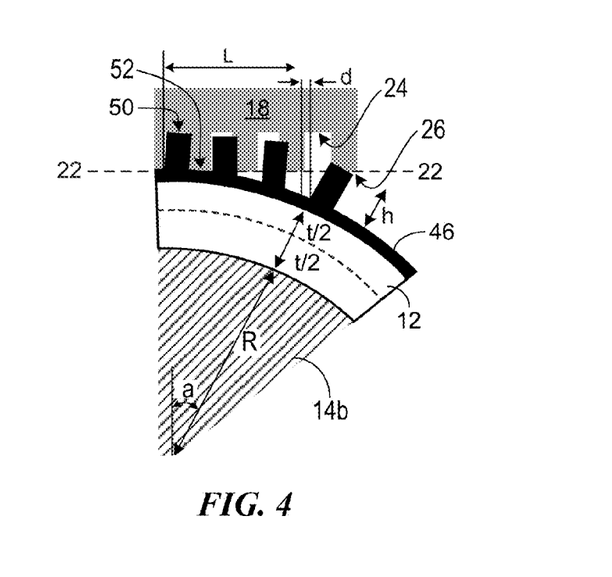
FIG. 4 illustrates a simplified side view of an exemplary method for template separation from a film sheet during an imprint lithography process.

Referring to FIG. 4, if materiality of substrate 12 is much softer than materiality of template 18, the majority of strain (d) to features 50 and 52 may be due to bending of substrate 12. Typically, strain magnitude may be less than 1 micron, however, even this may result in fine feature failure. In order to compensate for strain error at an interface between template 18 and substrate 12 during separation, the portion of substrate 12 being separated may be intentionally shorted.

In one embodiment, portions of substrate 12 may be classified as spreading portions (i.e., portions of substrate 12 having formable material 34 spreading and solidifying thereon) and separating portions (i.e., portions of substrate 12 wherein template 18 is being separated from the solidified pattern layer on substrate 12). A spreading portion is labeled as section A in FIG. 5 and a separating portion is labeled as section B. A higher tension may be applied to spreading portion A as compared to separating portion B. The magnitude of tension difference may be a function of materiality of substrate 12 and/or radius of rollers 14b and 14c.

Figure 5:
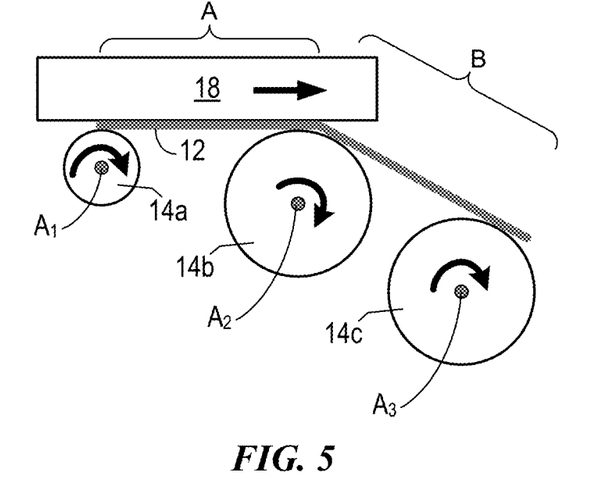
FIG. 5 illustrates a simplified side view of an exemplary method for template separation from a film sheet during an imprint lithography process.

In one example, the magnitude of tension in spreading portion A is significantly higher as compared to tension in separating portion B. Excessive tension to spreading portion A, however, may result in buckling of substrate 12 in the axle direction. As such, the magnitude of such applied tension may be limited.

In another example, rollers 14b and 14c may include a large radius as compared to roller 14a, with rollers 14a and 14b again serving imprint and separation functions and added roller 14c providing further support. A large radius may decrease relative strain, which may reduce a difference between higher tension and lower tension in substrate 12. In one embodiment, a distance between rollers 14a and 14b may be fixed and radius of roller 14a may be significantly smaller than radius of roller 14b as illustrated in FIG. 5. For example, the distance between rollers 14a and 14b may be approximately 100 mm with radius of roller 14a at approximately 20 mm and radius of roller 14b and/or 14c at approximately 40 mm.

Additionally, rollers 14 may be formed of softer material (e.g., 200 microns thick PET). By supporting substrate 12 with softer material, reduced tension may compensate the strain more effectively. Material stiffness of rollers 14 may be several times softer than that of substrate 12. For example, rollers 14 may be provide a supporting material formed of silicon, rubber, or the like. Also, thickness of rollers 14 (e.g., 1 mm) may be significantly larger than that of substrate 12 (e.g., 200 microns).

Additionally, sensors may be used to monitor initial alignment between template 18 and substrate 12 and/or alignment during separation of template 18 and substrate 12. By monitoring alignment during separation, tension of separation portions of substrate 12 may be adjusted. For example, if strain matching error indicates that patterned layer 46 is stretched, tension of the separation portion of substrate 12 may be lowered.

Strain matching may be provided by monitoring patterned layer 46 and/or alignment marks of substrate 12 and/or template 18. For example, in one embodiment, a first set of sensors may be positioned along axis $A_1$ of roller 14a and a second set of sensors may be positioned slightly offset from axis $A_2$ of roller 14b (i.e., the separation roller).

Various alignment error measurement methods and systems may be utilized with system 10. When substrate 12 is pre-patterned with alignment marks, alignment error signals may be collected by overlapping marks with alignment marks of template 18. Optical imaging methods, such as box in box or Moiré patterns may be adapted for measurement.

If substrate 12 is not pre-patterned with alignment marks, strain compensation conditions at the separation portion of substrate 12 may still be measured. For example, as substrate 12 bends, features 50 and 52 of patterned layer may be displaced away from their original locations, such that the patterns of template 18 and patterned layer 46 may generate distinct optical signals as compared to strain-matched case. This may be sensed using microscopic imaging, laser/LED sensing, and the like.

Figure 6:
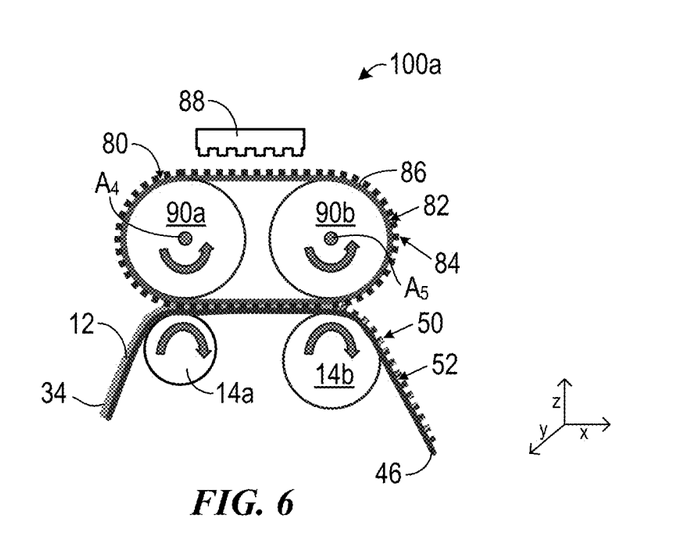
FIG. 6 illustrates a simplified side view of an exemplary embodiment of a lithography system in accordance with the present invention.
Figure 7:
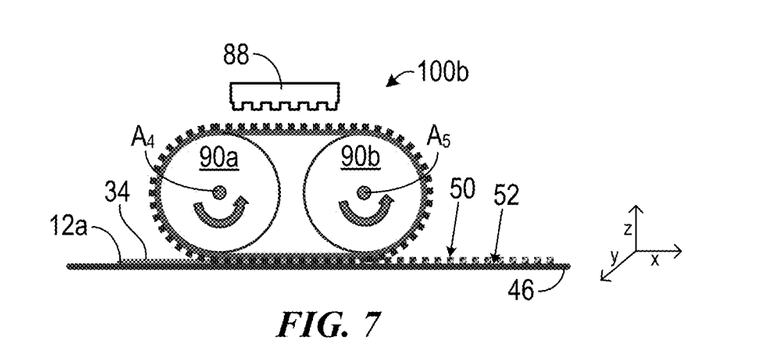
FIG. 7 illustrates a simplified side view of an exemplary embodiment of a lithography system in accordance with the present invention.
Figure 8:
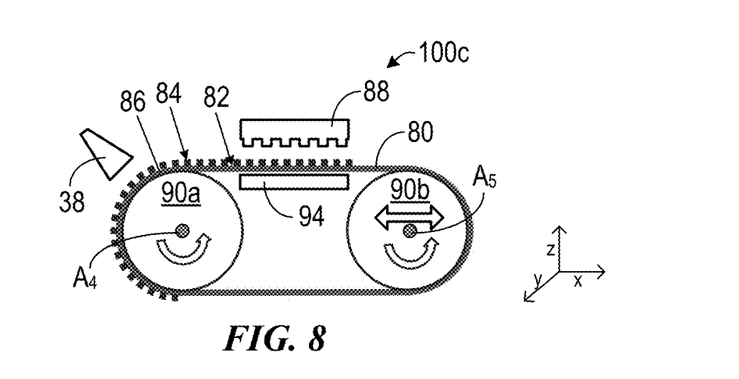
FIG. 8 illustrates a simplified side view of an exemplary embodiment of a lithography system in accordance with the present invention.

FIGS. 6-8 illustrate exemplary embodiments of lithography systems 100a-100c using continuous template 80 (i.e., belt template) in accordance with the present invention. Continuous template 80 may be used for imprinting on a film type substrate 12 (shown in FIG. 6) or a large flat substrate 12a (shown in FIG. 7).

Continuous template 80 may include a patterning area 82. Patterning area 82 may include features (i.e., protrusions 84 and recessions 86). Protrusions 50 and recessions 52 of patterned layer 46 may be formed in a similar manner as described previously. In one embodiment, template 80 may include stepped boundaries (e.g., mesas) configured to contain formable material 34 during imprinting.

Template 80 may be coupled to rollers 90a and 90b. Rollers 90a and 90b may be moveable in a clockwise and/or counter-clockwise manner about an axis $A_x$. For example, roller 90a is movable about axis $A_4$ and roller 90b is movable about axis $A_5$. Additionally, rollers 90a and 90b may be movable about an x-axis and a y-axis.

Various methods may be used to form template 80. In one embodiment, patterning area 82 of template 80 may be formed by replication from a master mold 88. If the length of the template 80 is multiple times longer than the length of the master mold active area, features 84 and 86 of patterning area 82 may be generated by repeated imprints using master mold 88. For example, features of patterning area 82 may be generated using an imprinting scheme similar to the method detailed in relation to FIGS. 1 and 2. If the master mold contains a whole imprinting area of the length of template 80, template replication can be done by translating the master mold whole rolling the template 80 so that whole patterns can be transferred to the replica template as a single field without stitching.

Strain matching conditions may be provided by using similar tension control schemes as detailed in relation to FIGS. 4 and 5 wherein fluid spreading section of template 80 may be under higher tension and separation section of template 80 may be under a lower tension.

Referring to FIG. 8, in another embodiment, template 80 may be formed using a supporting chuck 94. Supporting chuck 94 may aid in holding the imprinting portion of template 80 during formation of patterning area 82. Exemplary supporting chucks 94 and methods of use are further described in U.S. Pat. No. 8,817,515, which is hereby incorporated by reference herein in its entirety. In still another embodiment, template 80 may be formed via separated tools or fabricated in the same tool wherein substrate 12 is imprinted.

Figure 9:
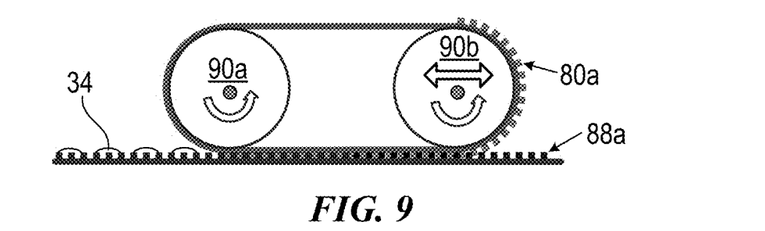
FIG. 9 illustrates a simplified side view of an exemplary embodiment of a lithography system in accordance with the present invention.
Figure 10:
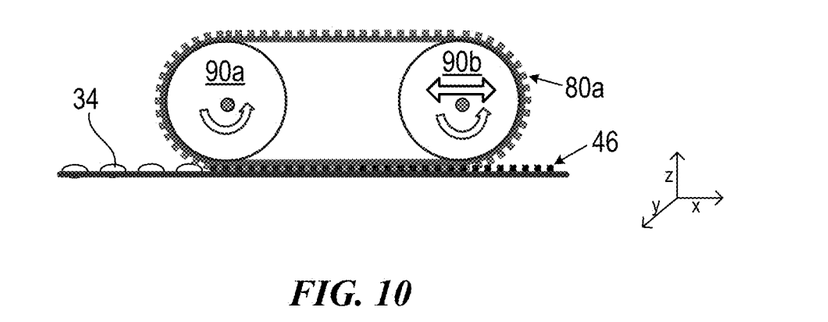
FIG. 10 illustrates a simplified side view of an exemplary embodiment of a lithography system in accordance with the present invention.

When the master template is made of a large size format similar to that of imprinting substrate, replica template 80a can be made from large master template 88a where the solidified imprinting layer is attached to the replica side, as depicted in FIG. 9. Fluid dispensing of imprinting material 34 can be done either on the master template 88a, as depicted, or the replica film surface (not shown). Replica template 80a can be post-processed after the replication imprinting, such as surface treatment, metal deposition, cleaning and others. Replica template 80a can then be used to imprint substrates. For example, as shown in FIG. 10, a flexible substrate can be loaded on to the same stage or platform instead of master template 88a and where fluid dispensing of imprinting material 34 can be done either on the substrate, as shown, or on replica template 80a itself (not shown), and imprinting can be performed as previously described herein. In this manner, template replication and imprinting can be performed on the same tool platform.

Patterning area 82 on template 80 may formed and placed into use within lithography systems 100a-100c without an etching process. Alternatively, patterning area 82 may be further processed using treatments including, but not limited to, etching (e.g., VUV etching), vapor treatment, chemical vapor deposition, and the like; for example, etching techniques, such as those known within the industry and those described in U.S. Patent Publication No. 2011/0183521, which is hereby incorporated by reference in its entirety.

A cleaning and/or removing apparatus may be provided during fabrication of template 80. For example, if template 80 becomes damaged and/or patterning area 82 is not properly formed or processed, an in-line cleaning process may be used to minimize down-time of the system. Further, since no additional loading/unloading process of template 80 may be needed, overall tool environment may be maintained substantially clean.

Referring to FIG. 6, generally, substrate 12 may contain a continuous imprint. To provide for such, in one embodiment, template 80 may be formed having no open spaces in patterning area 82. Rollers 90a and 90b may also be moveable in a clockwise and/or counter-clockwise manner. Such movement may generate a fully patterned patterning area 82 of template 80 with or without gaps between fields and may be in lieu of or in addition to template 80 having no open spaces.

Circumferential length (i.e., belt length) of template 80 may be balanced to correspond to field length being imprinted on substrate 12. For example, circumferential length may be substantially matched to the number of imprints multiplied by the size of the field. Substantially exacting circumferential length to desirable length, however, may be difficult. As such, adjustment of circumferential length prior to replication of master template 88 to template 80 may aid in balancing. Additionally, the surface of template 80 may be processed to include alignment marks. These alignment marks may have features above or below 100 nms. For example, alignment marks may be made of micron-sized lines and/or other patterns.

Once template 80 is mounted to rollers 90a and 90b, its length may be measured with respect to the field size of master mold 88. For example, if the field size is 100 mm in length, and if five imprints form a group of equally spaced patterns on template 80, then the length of template 80 may be adjusted to about 500 mm+/−e, where e is the error budget. The length of template 80 under no loading/tension may also be reasonably matched to a desirable length. Final adjustment of the length of template 80 may be provided by adjusting tension in template 80. For example, the distance between rollers 90a and 90b may be adjusted to varying tension in template 80. In another example, only the imprinting portion of template 80 may be adjusted.

In one embodiment, template 80 may include a stitched region if the belt is made of a piece of long flexible substrate. Due to the surface roughness, the stitched region may be prevented from contacting fluid 34 and/or substrate 12. In one embodiment, the stitched region may exceed what is considered an acceptable spacing between fields. As such, more than one template 80 may be used. For example, a first template 80 may possess a first number of fields (e.g., half), and a second template 80 may possess the remaining number of fields.

Formable material 34 may be applied to template 18 and/or substrate 12. In one embodiment, a first material may be applied to template 18 and a second material may be applied to substrate 12. The first material and the second material may be similar or different and form the basis for formable material 34.

Nano-imprinting with drop-on-demand dispensing that includes low viscosity material (e.g., formable material 34) may result in imprints having a very thin imprinting layer. Features 84 and 86 are usually connected with a residual layer as a base. Thin and uniform residual layers tend to be highly desirable for both etching processes and optical properties. Drop-on-demand dispensing may compensate for errors due to fluid evaporation, pattern density variation, material shrinkage, and the like. Imprinting on film-type substrate 12 may also be benefited by implementing drop-on-demand dispensing. By generating a thin and uniform residual layer, in-line etching may be implemented as well.

Template 80 may be positioned in proximity with substrate 12 such that formable material 34 spreads within a gap between template 18 and substrate 12. Additional rollers (not shown) may be used to maintain substrate-fluid-template configuration such that formable material 34 may spread and fill the gap. The additional rollers may be substantially similar to rollers 90a and 90b. In one embodiment, the surface of the additional rollers 90 may be formed of soft plastic or polymer layer such that the additional rollers can generate uniform conforming pressure to the template-fluid-substrate stack.

Alignment and magnification control may be adjusted in-line. For example, alignment error at spreading regions of formable material 34 may be determined, and such error compensated for by adjusting tension control of template 80. In one embodiment, piezo actuators may be used to alter distance between rollers 90*a* and 90*b*, adjusting tension control. As the distance between rollers 90*a* and 90*b* is altered, length of template 80 may be altered, in turn making magnifying field changes in the direction of template 80 (i.e., the direction of belt travel).

Energy for solidification of formable material 34 (e.g., UV curing) may be provided from the direction of template 80 and/or the direction of substrate 12. In one embodiment, substrate 12 may be coated with a non-transparent material. As such, energy for solidification of formable material 34 may be provided from the direction of template 80.

During separation of template 80 and substrate 12, both template 80 and substrate 12 may be bent apart from one another. If the roller diameters are identical between the template roller and the substrate roller and also if the material property of the template is similar to that of the flexible substrate, strain induced distortion may be less as compared to other imprinting schemes described herein.

Figure 11:
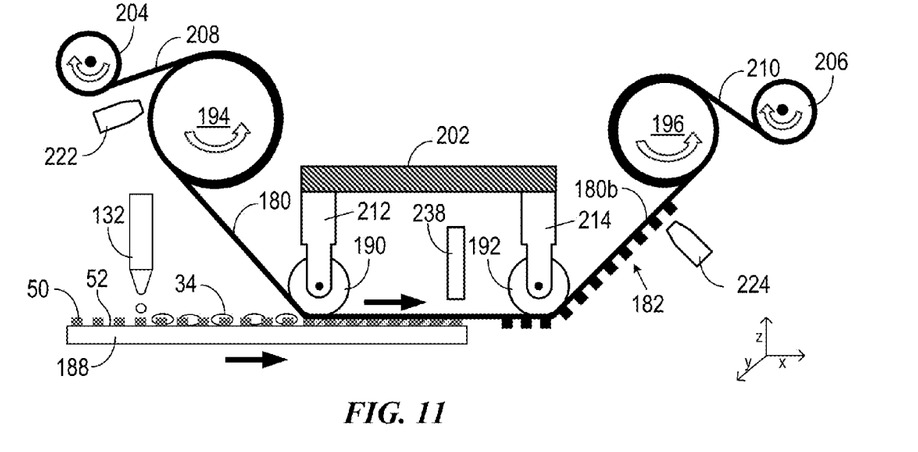
FIG. 11 illustrates a simplified side view of an exemplary embodiment of a lithography system in accordance with the present invention.

In further embodiments, one or more replica templates may be formed on a flexible film substrate by replicating patterns from a master template. Referring to FIG. 11, flexible film sheet substrate 180 is secured at either end to winding rollers 194 and 196 and routed under and supported by imprint/separation rollers 190 and 192. Rotation of rollers 194 and 196 can be synchronized such that flexible film sheet substrate 180 translates in-between rollers 190 and 192 in forward or reverse directions, depending on the rotational direction of rollers 194 and 196. Master template 188 containing pattern features is translated in the same direction as flexible film sheet substrate 180. Dispenser 132 can dispense polymerizable material 34 directly onto master template 188 as shown, or alternatively, polymerizable material can be dispensed onto flexible film sheet substrate 180 itself (not shown). As flexible film sheet substrate 180 and master template 188 come in contact, polymerizable material 34 can be cured, as has been previously described, to create corresponding patterned features on flexible film sheet substrate 180 to form replica template 182. During separation of replica template 182 from master template 188, stronger adhesion exists for the film-side replica template 182 as compared to the master-side template 180. As film replica templates 182 are wound about roller 196, a layer of protection film can be provided on the template surfaces to prevent the fine feature patterned surface from contacting the relatively harder backside surface of the flexible film, as further described. As can be appreciated, this template replication process can be utilized to convert a full length of flexible film substrate into multiple replica templates.

Figure 12:
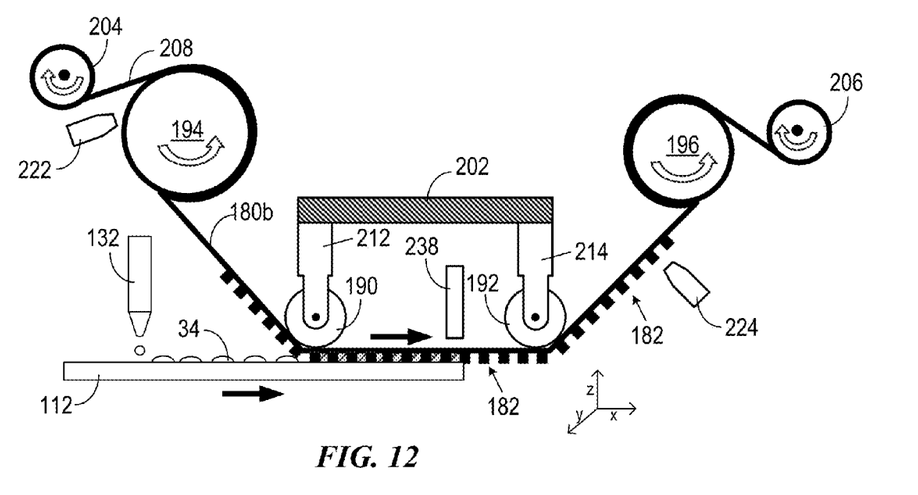
FIG. 12 illustrates a simplified side view of an exemplary embodiment of a lithography system in accordance with the present invention.

Referring to FIG. 12, flexible film sheet 180*b* containing replica templates 182 can be used to transfer patterns via imprint lithography methods onto substrate 112. Substrate 112 can be, for example, a flat glass-type substrate. Prior to the imprinting process, the surface of replicated template 182 may optionally be treated to enhance the release step. In one example, each replica template 182 formed on flexible film sheet 180*b* can be used to imprint one field on substrate 112 and then a new portion of flexible film sheet 180*b* containing the next replica template 182 is rolled into the imprinting location, which can print onto a new location on substrate 112 or alternatively onto another substrate that replaces substrate 112. Once the last template 182 on flexible film sheet 180*b* is used, such that the majority of flexible film sheet 180*b* and templates 182 are wound around roller 196, the imprinting direction can be reversed, with translational movement of flexible film sheet 180*b* now being from roller 192 toward roller 190 (and with the movement of substrate correspondingly reversed) so as to repeat another whole cycling of imprinting. Alternately, flexible film sheet 180*b* can be rewound onto roller 194 and a new cycle of imprinting can proceed in the same original direction. In further approaches, in similar fashion multiple substrate fields can be patterned using the same templates 182 on flexible film sheet 180*b*. Once a pre-determined number of fields are made, the used flexible film sheet 180*b* having used templates 182 is rolled out and a new flexible film sheet 180*b* having new templates 182 is loaded into the imprinting location.

When patterning relatively large fields, planar irregularities in the flat substrate and/or the flexible film substrate, whether localized or due to planar mismatch between the two substrates (i.e., one being out-of-plane relative to the other) can adversely affect imprint fluid (polymerizable material) spreading and fill uniformity. This in turn can lead to feature non-uniformity and/or defects in the subsequently cured patterned layer. To compensate, motion actuators can be coupled to the ends of rollers 190 and 192 to provide independent up and down motion to each roller end. Referring to FIGS. 11-12 actuators 212 and 214 are secured to frame 202 and coupled to the ends of rollers 190 and 192, respectively, to provide for such movement. Similar actuators are provided at the other ends of each roller 190 and 192 (not shown). This configuration allows the film substrate supported between rollers 190 and 192 to be moveable in four separate degrees of freedom (Z, Y-tilting, X-tilting and skewing motions) in order to better conform the two substrates to one another during the critical fluid spreading and filling and curing steps. A controller (not shown) provides independent signals to each actuator to trigger the direction and magnitude of movement or force of each to produce the coordinated conformance of the substrate. Actuators suitable for use in the present invention include simple electric motors, such as voice coil actuators, as well as other suitable known actuators or motors capable of delivering up and down (Z-axis) translation movement to the roller ends.

It is further important in imprint lithography to maintain the formed template as free as possible from particle contamination. Trapping of contaminating particles on the template can both cause defects in the imprinted pattern on the flat substrate surface at each imprint as well as damage the formed features of the template itself. The latter scenario leads to repeat defects and may require replacement of the entire template. Similarly, even prior to template formation, it is advantageous that the flexible film substrate should be similarly protected. Referring to FIG. 11, protective film sheet 208 is shown overlayed onto that portion of flexible substrate 180 that is wound about winding roller 194 with a portion of the protective film sheet 208 extending from winding roller 194 and secured to protective film roller 204 which is positioned adjacent winding roller 194. Protective film 208 is softer (i.e., lower modulus) than flexible film substrate 180, and can be formed of materials including but not limited to soft plastic films, such as acrylic, LDPE, PET, PVC or the like. Protective film 208 can be single or double layer, and can further include a low-tack adhesive film with a backing or a static cling film. As flexible substrate 180 is unwound from roller 194, protective film roller 204 is rotated in the opposing direction from roller 194 to peel away or retract protective film 208 from flexible substrate 180. A similar arrangement is provided with respect to winding roller 196, with protective film roller 206 likewise positioned adjacent winding roller 196. As flexible substrate 180 now containing formed template (or field) 182 is wound around winding roller 196, protective film sheet is feed toward and overlayed onto formed template (or field) 182 as it wound about winding roller 196. To further protect against particle contamination, electrostatic discharge devices 224 and 226, such as e.g. ionizers, are provided adjacent protective film rollers 194 and 196, respectively, in locations near to the lamination or delamination of protective film 208 from flexible substrate 180. Devices 224 and 226 remove electrostatic charge in the localized atmosphere, thus reducing charge interactions that may otherwise attract charged particulates that can cause particle contamination.

Figure 13:
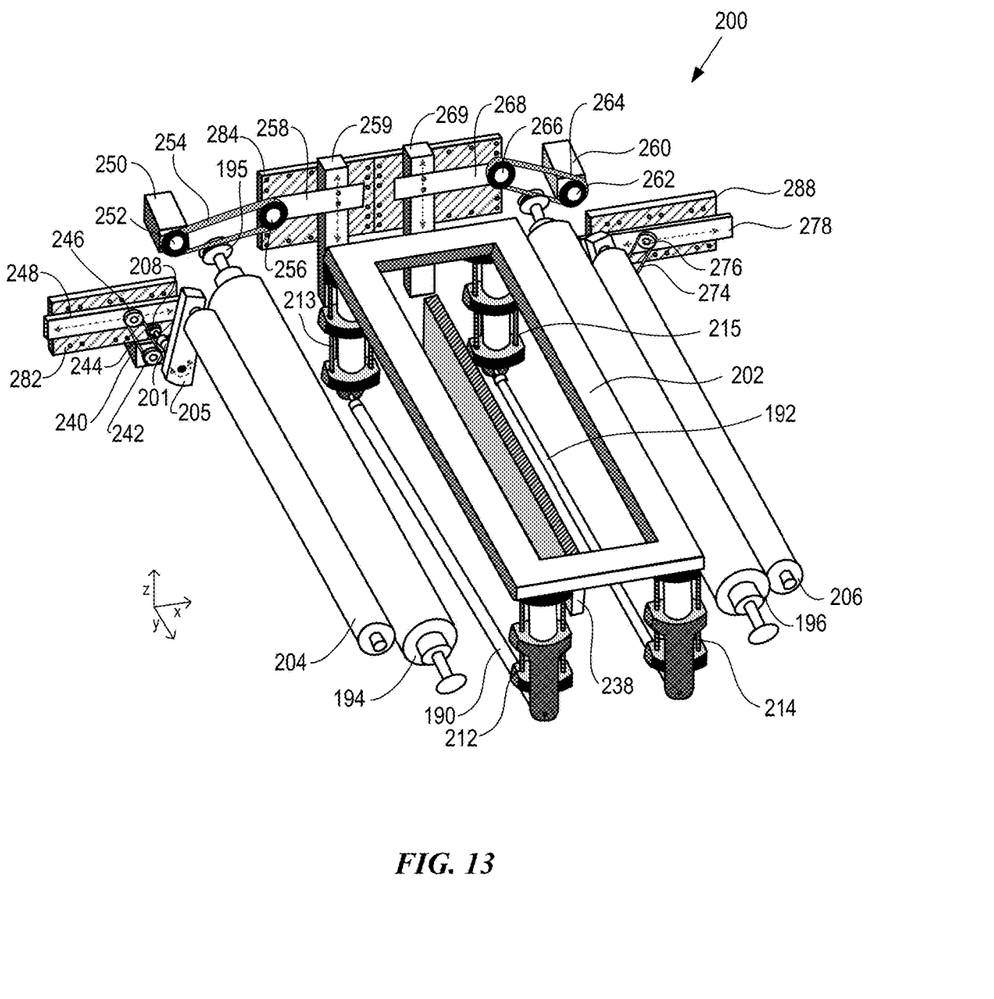
FIGS. 13 and 14 illustrate simplified top and bottom perspective views of an exemplary embodiment of a lithography system in accordance with the present invention.
Figure 14:
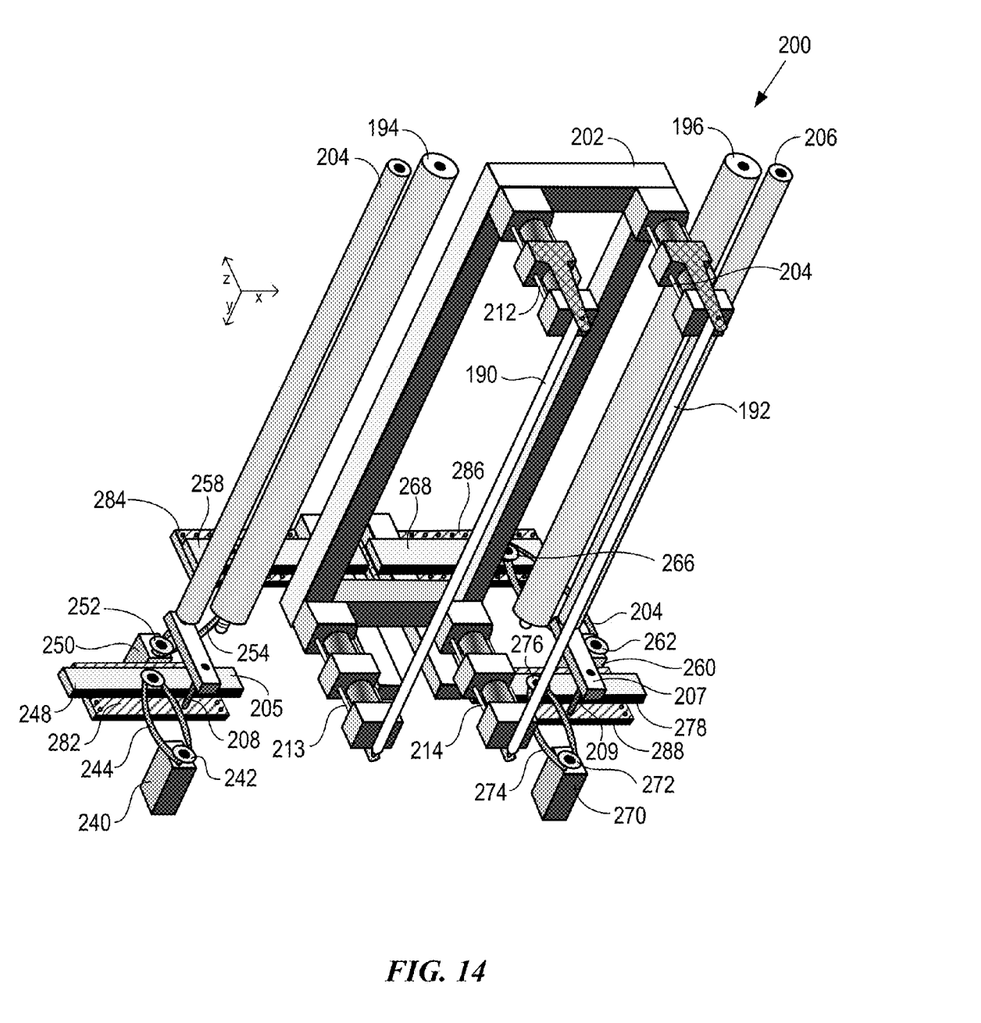

FIGS. 13 and 14 depict a further embodiment of the roller system described above having imprint/separation rollers and winding rollers. System 200 includes fixed rectangular support frame 202 with voice coil actuators 212, 213, 214 and 215 mounted at each corner of the frame extending downward. Imprint/separation rollers 190 and 192 are rotatably connected at each opposing end to the moveable arms of voice coils 212, 213 and 214, 215, respectively. Voice coils 212-215 are operably connected to a control system (not shown) that can independently control the direction (up/down) and magnitude (distance) of movement of each individual voice coil, thereby providing for independent movement of each end of the first and second imprint/separation rollers 190 and 192. Such independent movement, in turn, allows for that portion of a flexible film substrate supported between the first and second imprint/separation rollers can be subjected to Z, Y-tilting, X-tilting and skewing motions as previously described. Imprint/separation rollers 190 and 192 as depicted are configured for passive rotation, although alternatively they can likewise be configured for active rotation to assist in advancing the flexible film substrate. UV light source 238 is positioned adjacent to (and can be secured to) support frame 202. As depicted, the UV light source is configured to provide UV energy along a pathway that extends a length substantially equal to the length of imprint/separation rollers be directed against the backside Winding rollers 194 and 196 are positioned to either side of the frame 202, voice coils 212-215, and imprint/separation roller 190, 192 assembly, with each roller 194, 196 likewise supported by and rotatable upon a separate moveable frame stand (not shown) at either end of each roller. Winding rollers 194 and 196 further terminate at their distal ends in pulleys 195 and 197, each of which are engageable with belts 254 and 264, respectively, as is further detailed. Adjacent to winding rollers 194 and 196 are protective film rollers 204 and 206, respectively, which are likewise mounted on to separate moveable frame stands (not shown). Each protective film roller 204 and 206 is further pivotable toward and away from winding rollers 194 and 196, respectively, to accommodate for the change in working diameter of the rollers as protective film is wound about and/or unwound from the rollers. As depicted, protective film rollers 204 and 206 are coupled at their distal ends to ends of pivot arms 205 and 207, respectively, with the opposing end of each pivot arm 205 and 207 connected to and pivotable about drive rods 201 and 203 that in turn terminate in pulleys 208 and 209, respectively. Pulleys 208 and 209 are engageable with belts 244 and 274, respectively, as is further detailed. Pivoting arms (not shown) are similarly provided to couple the proximal ends of protective film rollers 204 and 206 to the moveable frame stand (not shown), such that the axes of the protective film rollers 204 and 206 remain parallel with the axes of the adjacent winding rollers 194 and 196 as protective film rollers 204 and 206 pivot towards or away from the winding rollers 194 and 196, respectively.

Belt drive assemblies for driving (i.e., rotating) winding rollers 194 and 196 include motors 250 and 260 that drive belts 254 and 264, respectively. As depicted, belt 254 is operably connected to pulley 252, driven by motor 250, and to pulley 256 which is secured to frame 258. Frame 258 is translationally coupled to post 259, that is, frame 258 can translate in the vertical (z) direction up or down relative to post 259. Similarly, belt 264 is operably connected to pulley 262, driven by motor 260, and to pulley 266 which is secured to frame 268, with frame 268 translationally coupled to post 269 such that it too can translate in the vertical (z) direction up or down relative to post 259. Posts 259 and 269 themselves are securely fixed to plate mounts 284 and 286, which are secured to a stationary support (not shown). As previously described, pulleys 195 and 197 at the distal ends of winding rollers 194 and 196 engage drive belts 254 and 264 such that during operation motors 250 and 260 via drive belts 254 and 264 control the winding direction, force, and tension applied to winding rollers 194 and 196. In addition, winding rollers 194 and 196 can be disengaged from drive belts 254 and 264 through the upward movement of posts 259 and 269. That such movement produces a corresponding upward movement of pulleys 256 and 266 which disengages belts 254 and 264 from pulleys 195 and 197. In this manner, the winding roller assembly can be easily removed and replaced.

Similar belt drive assemblies are provided for maintaining tension on protective film rollers 204 and 206. Motors 240 and 280 that drive belts 244 and 274, respectively. Belt 244 is operably connected to pulley 242, driven by motor 240, and to pulley 246 which is secured to frame 248. Frame 248 is translationally coupled to plate mount 282 such that can translate in the horizontal (x) direction. Belt 274 is operably connected to pulley 272, driven by motor 270, and to pulley 276 which is secured to frame 278. Frame 278 is likewise translationally coupled to plate mount 288 such that it too can translate in the horizontal (x) direction relative. Plates 282 and 288 are secured to a stationary support (not shown). As previously described, pulleys 208 and 209, which themselves are connected through pivot arms 205 and 207 to protective film rollers 204 and 206, are engageable with drive belts 244 and 274, respectively. During operation, motors 240 and 270 drive belts 244 and 274 and, through pivot arms 205 and 207, control pivoting motion and tension applied to protective film rollers 204 and 206. This both controls the distance between each protective film roller and associated winding roller, as well as controls the tension applied to the protective film itself. Further, similar to the winding roller assembly described above, protective film rollers 204 and 206 can likewise be disengaged from drive belts 244 and 274 through horizontal movement of frames 248 and 278 away from rollers 204 and 206. That is, such movement moves pulleys 246 and 276 away from pulleys 208 and 209 and disengages belts 244 and 274 from pulleys 208 and 209. In this fashion, the protective film roller assembly can be likewise be easily removed and replaced, either in conjunction with or separate from the removal and replacement of the winding roller assembly.

Figure 15:
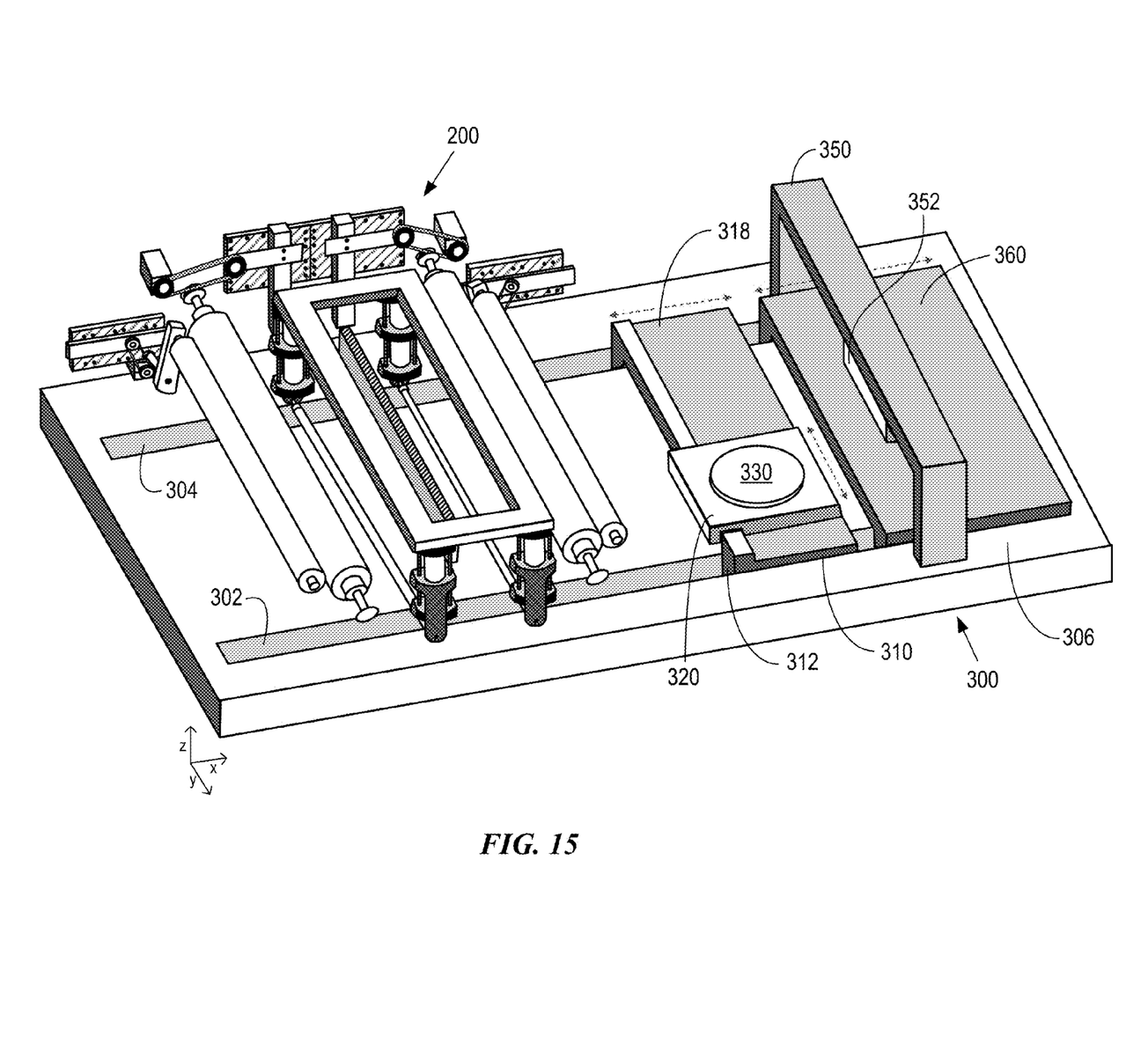
FIG. 15 illustrates a simplified perspective view of an exemplary embodiment of a lithography system in accordance with the present invention.

Turning to FIG. 15, roller system 200 can be further incorporated into system 300 that can provides for both the generation of flexible film templates and/or imprinting flat substrates, including large area substrates, using such flexible film templates. System 300 includes stage 306 with roller system 200 provided in a fixed position in relation to stage 306. Stage 306 further includes tracks 302 and 304 which accommodate translation of motion stages 310 and 360 in the x-direction such that substrates secured to either motion stage 310 or 360 can be co-translated with a flexible film substrate (or template) secured to roller system 200 in the manner previously described. Motion stage 310 is further provided with smaller stage 320 which is translatable in the y-direction along lip 312 of motion stage 320. Stage 320 is further provided with chuck 330. Chuck 330 can be adapted to secure, e.g., a silicon wafer customary to the industry, or other flat substrates of similar size. By contrast, motion stage 360 can be configured with a chucking system that accommodates larger area flat substrates, such as glass substrates useful in preparing glass panel displays. Such substrates can have a width up to the length of the imprint/separation and/or winding rollers of system 200. Support 350 includes fluid dispense system 352 that is capable of delivering polymerizable material in a desired pattern onto substrates positioned on either motion stage 310 or 360 as motion stage 310 or 360 passes beneath dispense system 352. In certain configurations, dispense system 352 is configured to be moveable in the y-direction as well. Dispense system 352 can be configured to dispense droplets of polymerizable material, as has been previously described. Alternatively, the dispense system can be configured to deposit polymerizable material in a thin film using e.g. a slot-die coating device. In such a latter approach a low viscosity resist or a resist with higher solvent content is preferred to achieve a thin residual layer, and drying and/or heating to remove the solvent can be performed after coating.

In various embodiments, system 300 can be used to create one or more replica templates by patterning a flexible film substrate that is provide on roller system 200 as previously described. In one such embodiment, a flat master template formed in e.g. silicon can be provided and secured to chuck 330 and used to pattern multiple fields along both a width and a length of a flexible film substrate in a step and repeat fashion. That is, after each imprint, the flexible film substrate can be repositioned and stage 320 containing the template can be advanced in the y-direction and the imprint process repeated to imprint an additional pattern adjacent the previous. Once an entire width of the flexible substrate is patterned in this fashion, the flexible substrate can be advanced and a next series of patterns imprinted. Alternatively, adjacent patterns in the x-direction can be imprinted followed by translation of the template in y-direction to a next position, followed by repeated imprinting in the x-direction. In such fashion, a large area template of repeating patterns can be created on the flexible substrate.

Subsequently or separately, such a flexible template can then be used to pattern flat substrates of larger dimensions, including e.g., glass substrates for use in display panels. Motion stage 360 can be equipped with various chucking system to accommodate the desired substrate size.

While the above methods and systems have been described with respect to imprinting flat, glass-type substrates, flexible film type templates such as described and depicted can be used as well to imprint on a similar flexible film substrates. Furthermore, while the above methods and systems have also been described with respect to imprinting flexible film templates for use in subsequent imprinting of flat, glass-type substrates, such methods and systems can be used to generate a final patterned flexible film product, such as a flexible film containing gratings.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. An imprint lithography system for imprinting polymerizable material positioned between a flexible film substrate and a flat substrate, the system comprising:
    (a) first and second spaced-apart winding rollers configured to secure opposing ends of the flexible film substrate and to maintain a portion of the flexible film substrate wound around one or the other of the rollers;
    (b) one or more roller drive assemblies coupled to the first and second winding rollers, the drive assemblies configured to impart rotational force to the first and second winding rollers such that the flexible film substrate can be translated under a desired tension between the first and second winding rollers in a first direction and a second opposing direction;
    (c) first and second spaced apart imprint/separation rollers located proximate to first and second winding rollers, the first and second spaced apart imprint/separation rollers having parallel axes of rotation and further configured to engage and support the backside surface of a flexible film substrate as it is translated therebetween;
    (d) motion actuators coupled to each end of the first and second imprint/separation rollers, each motion actuator configured to provide independent movement such that that portion of the flexible film substrate supported between the first and second imprint/separation rollers can be subjected to Z, Y-tilting, X-tilting and skewing motions;
    (e) a motion stage having a first chuck configured to secure the flat substrate, the motion stage further configured to translate the flat substrate into superimposition with the flexible film substrate as the flexible film substrate is translated between the first and second imprint/separation rollers;
    (f) a fluid dispense system positioned proximate to the imprint/separation rollers and the motion stage, the fluid dispense system configured to dispense polymerizable material onto the flat substrate;
    (g) an energy source positioned between the imprint/separation rollers and adjacent the backside surface of the flexible film substrate, the energy source configured to provide curing energy to solidify polymerizable material positioned between the flexible film substrate and the flat substrate;
    (h) first and second protective film rollers positioned adjacent the first and seconding winding rollers, respectively, each protective film roller configured to overlay a protective film onto the front surface of the flexible film substrate as it is wound onto the winding roller and to retract the protective film from the front surface of the flexible film substrate as it is unwound from the winding roller; and
    (i) first and second electrostatic discharge devices positioned proximate the first and second protective film rollers, respectively, each electrostatic discharge device further configured to remove electrostatic charge from the front surface of the flexible film substrate as the protective film is overlayed onto or retracted from the front surface of the flexible film substrate.

2. The system of claim 1 wherein the fluid dispense system is further configured to dispense the polymerizable material as a plurality of droplets.

3. The system of claim 1 wherein the fluid dispense system is configured to dispense the polymerizable material as a thin film.

4. The system of 23 wherein the motion stage is further configured to translate the flat substrate parallel to (X-direction) and orthogonal to (Y-direction) the direction the flexible film translates.

5. The system of 23 further comprising a second chuck configured to secure a second flat substrate.

\* \* \* \* \*